United States Patent

Costas et al.

[11] Patent Number: 6,137,125
[45] Date of Patent: *Oct. 24, 2000

[54] TWO LAYER HERMETIC-LIKE COATING FOR ON-WAFER ENCAPSULATUON OF GAAS MMIC'S HAVING FLIP-CHIP BONDING CAPABILITIES

[75] Inventors: Varmazis D. Costas, Chelmsford; Anthony Kaleta, Lowell, both of Mass.

[73] Assignee: The Whitaker Corporation, Wilmington, Del.

[*] Notice: This patent is subject to a terminal disclaimer.

[21] Appl. No.: 09/019,627

[22] Filed: Feb. 6, 1998

Related U.S. Application Data

[63] Continuation-in-part of application No. 08/863,759, May 27, 1997, Pat. No. 5,914,508, which is a continuation of application No. 08/576,524, Dec. 21, 1995, abandoned.

[51] Int. Cl.[7] .................................................. H01L 29/80
[52] U.S. Cl. .......................... 257/275; 257/640; 257/778
[58] Field of Search .................................... 257/275, 635, 257/640, 642, 778, 77

[56] References Cited

U.S. PATENT DOCUMENTS

| | | | |
|---|---|---|---|
| 3,811,183 | 5/1974 | Celling | 257/778 |
| 4,714,516 | 12/1987 | Eichelberger et al. | 156/628 |
| 4,737,236 | 4/1988 | Perko et al. | 156/644 |
| 4,780,177 | 10/1988 | Wojnarowski et al. | 156/643 |
| 4,783,695 | 11/1988 | Eichelberger et al. | 357/65 |
| 4,835,704 | 5/1989 | Eichelberger et al. | 364/490 |
| 4,894,115 | 1/1990 | Eichelberger et al. | 156/643 |
| 5,073,814 | 12/1991 | Cole, Jr. et al. | 357/54 |
| 5,154,793 | 10/1992 | Wojnarowski et al. | 156/344 |
| 5,171,824 | 12/1992 | Marks et al. | 528/198 |
| 5,198,527 | 3/1993 | Marks et al. | 528/198 |
| 5,246,782 | 9/1993 | Kennedy et al. | 428/421 |
| 5,311,153 | 5/1994 | Lau et al. | 333/26 |
| 5,409,777 | 4/1995 | Kennedy et al. | 428/411.1 |
| 5,461,545 | 10/1995 | Leroy et al. | 361/765 |
| 5,497,033 | 3/1996 | Fillion et al. | 257/723 |
| 5,914,508 | 6/1999 | Varmazis et al. | 257/275 |

OTHER PUBLICATIONS

Amorphous and Crystalline Silicon Carbide IV; Proceedings of the 4th INternational conference, Santa Clara, CA, Oct. 9–11, 1991, Springer–Verlag, C.Y. yang, M.M. Rahman, G.L. harris (Eds.) pp. 271–280.

Inside Engineering . . . Balun Transformers For RF Chip Sets, Mixers and Broadband Impedance Matching, Feb. 1995, M/A–Com Loud & Clear /3., by Simon Gay.

IEEE Transactions on components, Hybrids, and Manufacturing Technology, vol. 16, NO. 7, Nov. 1993. Processing and Microwave Characterizaton of Multilevel Interconects Using Benzocyclobutene Dielectric, Percy B. Chinoy, and James Tajadod.

Abstract: Processing and Electrical Charzcterization of Multilayer Metallization For Microwave Applications, Percy B. Chinoy, M/A–Com, Inc Apr. 1995.

A. Phostosensitive—BCB on Laminate Technology (MCM–LD) ; IEEE Jan. 5, 1994 pp. 374–386.

Concise Chemical and Technical Dictionary; Edited by H. Bennett, F.A.I.C., Director, B.R. Laboratories, Miami Beach, FL Chemical Publishing Co., Inc.pp. 573 and279.

Abstract: ISHM '94 Proceedings M[4]CMx (Thin Film Multi–MMIC Multi—IC Modules) for Microwave Applications. Ernst Feurer, Martin Oppermann and Bruno Hall.

Abstract: 1995 IEEE; High Performance Microwave elements for SiGe MMICs, Michael Case, perry MacDonald, Mehran Matloubian, Mary Chen, Larry Larson and David Rensch, pp. 85–95.

*Primary Examiner*—Mark V. Prenty

[57] ABSTRACT

The present invention is drawn to a 2-layer hermetic coating for on wafer encapsulation of GaAs monolithic microwave integrated circuits and the flip-chip mounting thereof. The present invention utilizes the properties of benzocyclobutene (BCB) for use in high frequency microwave applications to capacitively decoupled the MMIC from the carrier substrate during the flip-chip mounting process. The present invention has the advantage of improved performance and reliable flip-chip mounting by the reduction in stress between the carrier substrate and the MMIC that often occurs in flip-chip mounting of the MMIC.

24 Claims, 4 Drawing Sheets

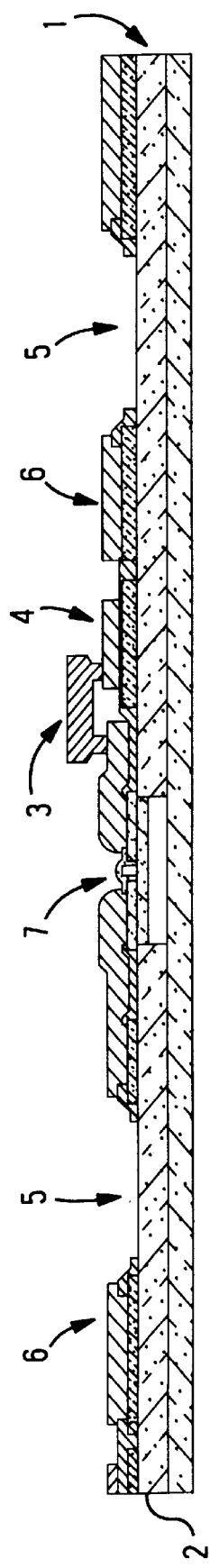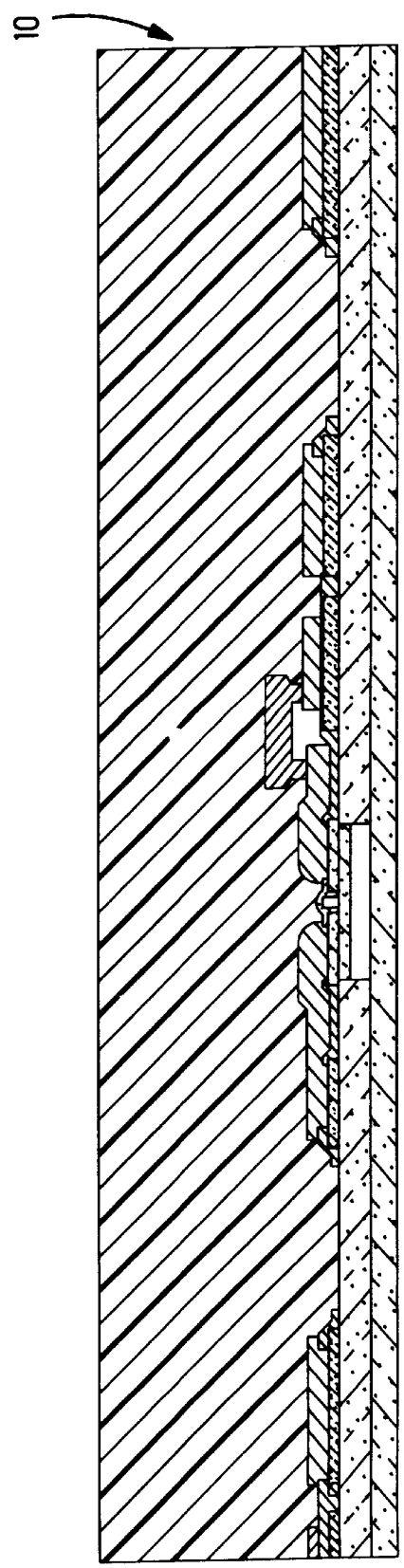

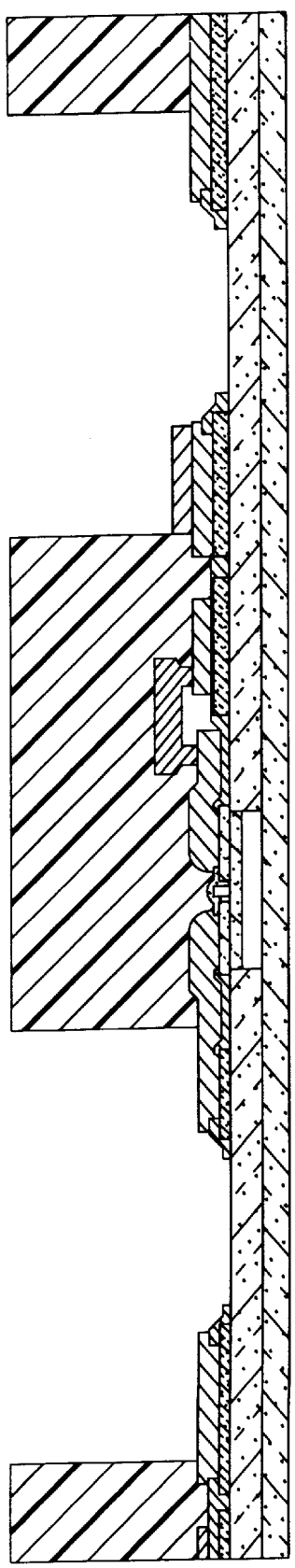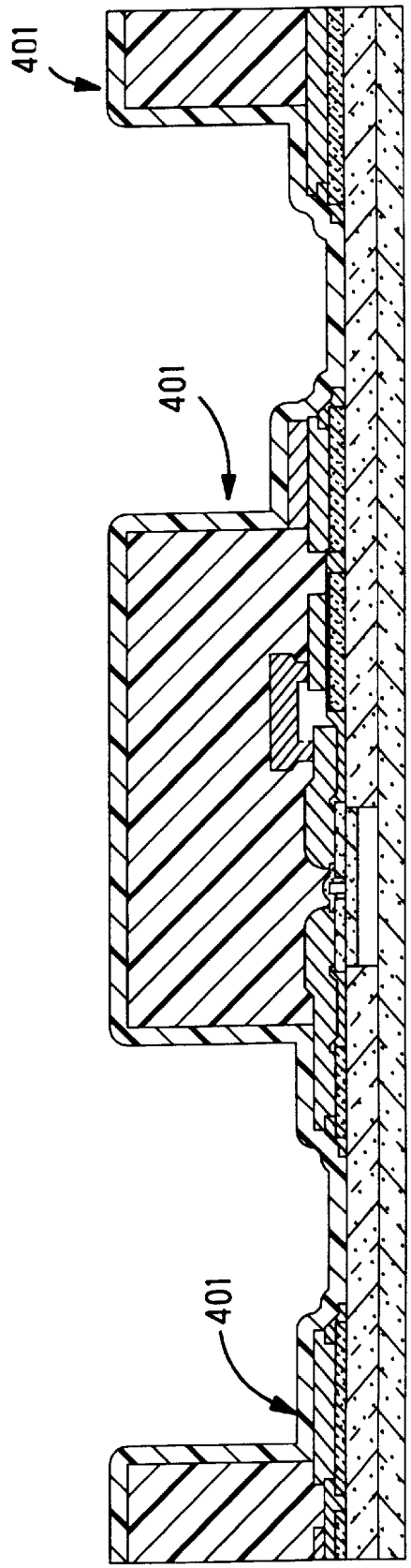

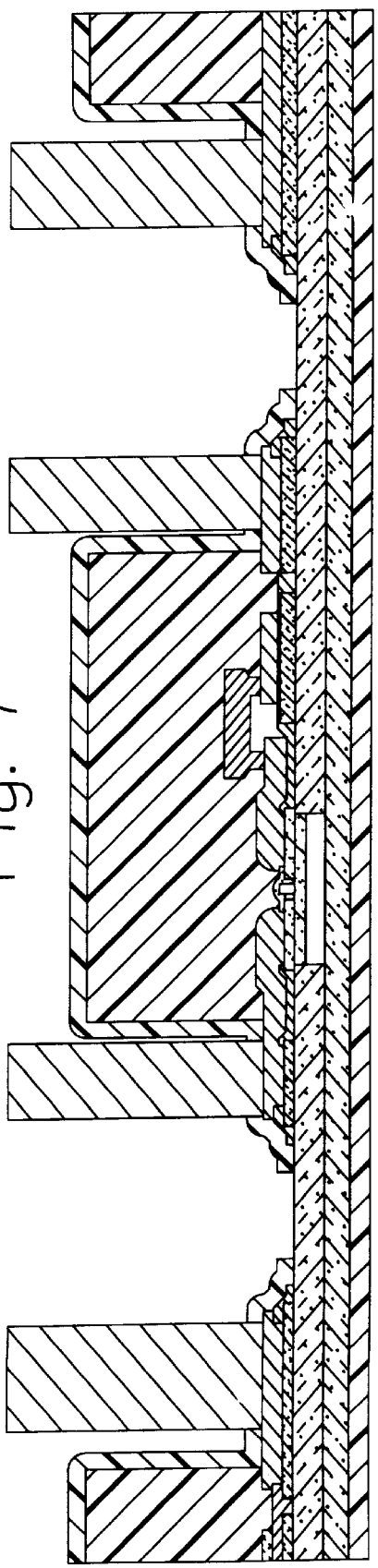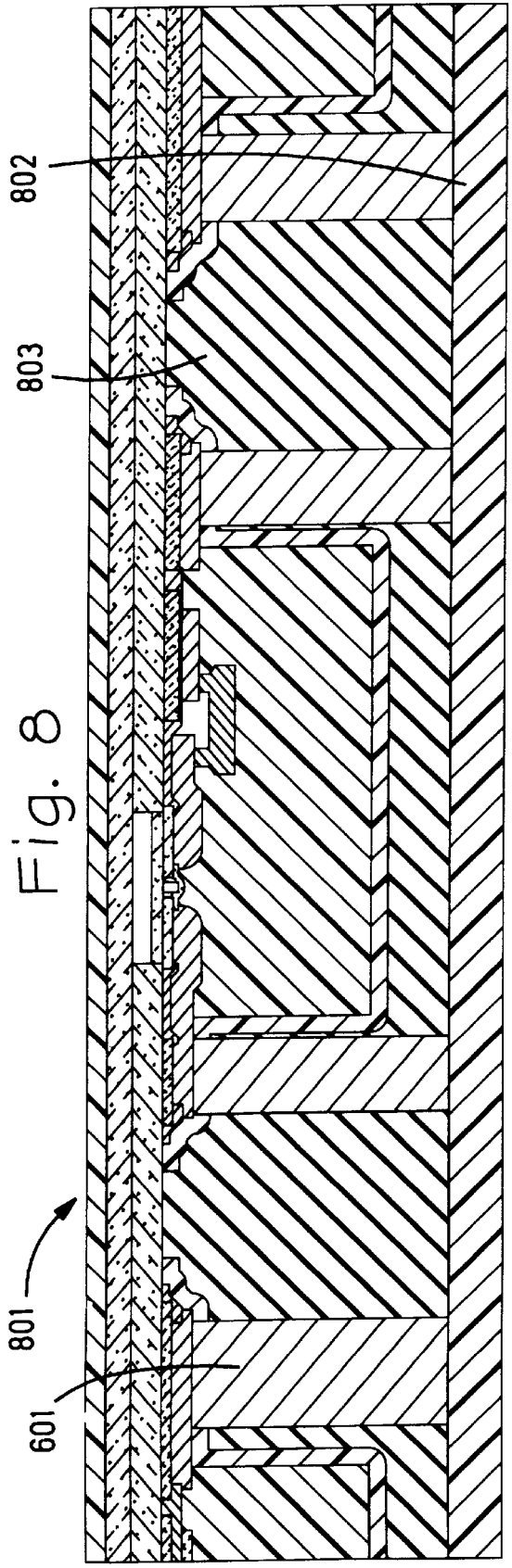

TWO LAYER HERMETIC-LIKE COATING FOR ON-WAFER ENCAPSULATUON OF GAAS MMIC'S HAVING FLIP-CHIP BONDING CAPABILITIES

FIELD OF THE INVENTION

The present invention relates to encapsulation of monolithic microwave integrated circuits (MMIC's) and flip-chip mounting thereof. The present invention is a continuation-in-part of U.S. patent application Ser. No. 08/863,759 filed May 27, 1997 now U.S. Pat. No. 5,914,508, which is a continuation of Ser. No. 08/576,524 filed Dec. 21, 1995 and now abandoned.

BACKGROUND OF THE INVENTION

Monolithic microwave integrated circuits (MMIC's) have a variety of applications and are used quite extensively in the wireless industry. Hermetic ceramic packages have been used for some time for the long-term protection of GaAs-based MMIC's but have considerable tradeoffs in both cost and weight. A low-cost light weight alternative can be offered by plastic packaging without compromising long-term device reliability. This is possible through the use of polymers for construction of the cavity as well as filler materials to form a barrier to moisture transport in the packaging cavity. As can be appreciated by one of ordinary skill in the art, it is necessary for long-term reliability to have necessary protection against moisture. While the use of these polymers in packaging applications has virtually no effect on the electrical performance of low-frequency devices, the relatively high dielectric permittivity and loss tangent of these polymers can cause a substantial degradation in the electrical performance of high-frequency analog MMIC'S. To this end, parasitic elements such as parasitic capacitance and parasitic inductance must be minimized as greatly as possible in order to avoid the deleterious effects of these parasitic elements. To this end, parasitic capacitance can cause frequency shifts and Q-factor deterioration as well as impedance matching problems, to name a few.

While many microwave control devices, for example switches and attenuators, are rendered less sensitive to fillers and moisture by the avoidance of the use of air bridges as well as by adding a final coating of silicon nitride, most analog devices, however, not only contain air bridges, but are also sensitive to the detuning effects of dielectric coatings. Since there is no practical way of accurately modeling arbitrarily shaped coatings of undefined thickness, it is very difficult to predict with any certainty any electrical performance perturbations of filler materials in MMIC chips prior to chip mounting, package closure and filling.

In addition to conventional interconnection and packaging of MMIC's, it is often necessary to utilize flip-chip die attach technology in order to properly thermally dissipate joule heat during operation and also reduce parasitic inductance effects. To this end, the use of hard or solder bumps on the device bonding pads reduces the area of the overall IC as well as eliminates the use of wire bonds which not only increase the labor input to the device, but also increase the potential for parasitic inductance problems. Additionally, the use of solder bumps enables a much better alignment of a device as well as improves the electrical performance of the device through the elimination of parasitic inductance as well as impedance mismatch problems. While flip-chip mounting of the IC to the carrier substrate has the attendant benefits of an improvement in electrical performance as well as better dissipation of heat, an inherent mechanical stress develops between the carrier substrate and the chip which is often unacceptable. One way to alleviate the stress between the carrier substrate and the chip is with the use of a conventional underfill, which is often a liquid polymer. Unfortunately, the underfill, while alleviating mechanical stress, often changes device performance as the dielectric permittivity of the underfill changes the FET internode capacitances. As stated above, in high frequency applications, parasitic capacitances must be minimized wherever possible, and with the use of an underfill it is very difficult to accurately model the effects of the underfill on the electrical performance and account for it.

Accordingly, what is needed is a technique for hermetically coating the MMIC in a manner which will enable the flip-chip bonding of the integrated circuit to the carrier substrate for ultimate packaging in a manner which will not degrade the electrical performance of the integrated circuit when the underfill material is used.

SUMMARY OF THE INVENTION

The present invention relates to a two-layer coating process for on-wafer encapsulation of GaAs MMIC's. This packaging approach takes advantage of the low dielectric permittivity of polymers such as benzocyclobutene (BCB) and the sealing properties of ceramic materials such as silicon carbide (SiC) or silicon nitride (SiN) to provide both mechanical protection to the MMIC's during handling and also protect the MMIC from moisture. The present invention enables predictable changes in the electrical performance of the coated MMIC's. To this end, by virtue of the properties of BCB, the effect of the BCB layer as well as the ceramic layer are readily predicted and incorporated into the design of the integrated circuit. To this end, benzocyclobutene (BCB) can be deposited in relatively thick layers, enabling effectively a capacitive decoupling of the underlying integrated circuit with respect to the underfill material and carrier substrate. Finally, benzocyclobutene is well proven as a low-loss material at high frequencies, and by virtue of this, there is very little loss in electrical performance (for example Q-factor) attributable to the use of BCB as the encapsulant. Further discussion of the characteristics of benzocyclobutene can be found in U.S. patent application Ser. No. 08/922,615, the disclosure which is specifically incorporated herein by reference.

As stated above, the use of solder bumps on the bonding pads has gained general acceptance in the high speed integrated circuit industry. To this end, bond pads are used in the interconnection of the various elements as required in the integrated circuit, and solder bumps are often used in place of wire bonds to reduce the inductive parasitics as well as impedance matching problems associated with the wire bonds. During processing, the wire bond pads are exposed and metallization is deposited thereon to effect the bonding pads. The solder bumps are formed on the bond pads and can be used for electrical interconnection but also can be used as the vehicle to dissipate joule heat. As stated above, while flip-chip bonding is used in a variety of applications, particularly where dissipation of heat is necessary, there are attendant disadvantages to conventional structures when an underfill is used to alleviate the stress between the carrier substrate and the chip. The present invention by virtue of the use of BCB as the encapsulant significantly overcomes this problem. To this end, the layer of benzocyclobutene can be made on the order of 7–8 microns in thickness. A coating of this thickness is great enough to decouple capacitively the MMIC from the underfill material and the carrier substrate. Accordingly, the device performance can be accurately modeled. The underfill can thereby be disposed between the coated MMIC and the carrier substrate with no further changes in performance and no further packaging required.

BRIEF DESCRIPTION OF THE DRAWINGS

FIG. 1 is a cross sectional view of the GaAs wafer after front-side processing has been completed.

FIG. 2 is a cross sectional view of the deposited low dielectric coating, benzocyclobutene, on the order of 7–10 microns in thickness.

FIG. 3 is a cross sectional view showing the structure of FIG. 2 after the pattern photo-resist and etching processes have been completed to open bond pads and streets as required.

FIG. 4 is a cross sectional view of the deposited encapsulation layer of silicon carbide or silicon nitride, on the order of 0.5 microns in thickness.

FIG. 7 is a cross sectional view of the device of the present invention after backside wafer processing has been completed.

FIG. 8 is a cross sectional view of the structure of FIG. 7 flip-chip mounted on a substrate.

DETAILED DESCRIPTION OF THE INVENTION

Figure 5:
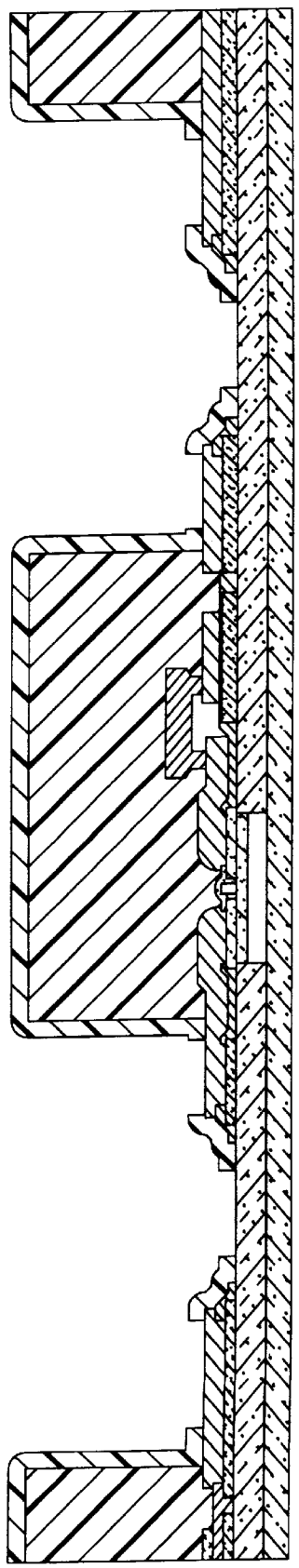
FIG. 5 is a cross sectional view of the MMIC of the present invention with the silicon carbide or silicon nitride having been selectively removed from the bond pads and the streets.

Referring to FIGS. 1 and 2 a coating process is comprised of applying a sufficient coating of a low dielectric polymer, preferably benzocylclobutane, 10 upon a processed wafer 1 which is a preferably gallium arsenide or another suitable semi-insulating or insulating substrate. The region 2 distinguishes the region of the wafer 1 which has been implanted with a suitable implant ion such as boron to effect required isolation between active devices (such as the MESFET 7) as is well known to one of ordinary skill in the art. The MMIC process also has other various components, well known in the art, such as airbridges 3, capacitors 4, streets 5, bond pads 6, and field effect transistors 7 (FET) overlying and attached to the gallium arsenide wafer 1.

Figure 6:
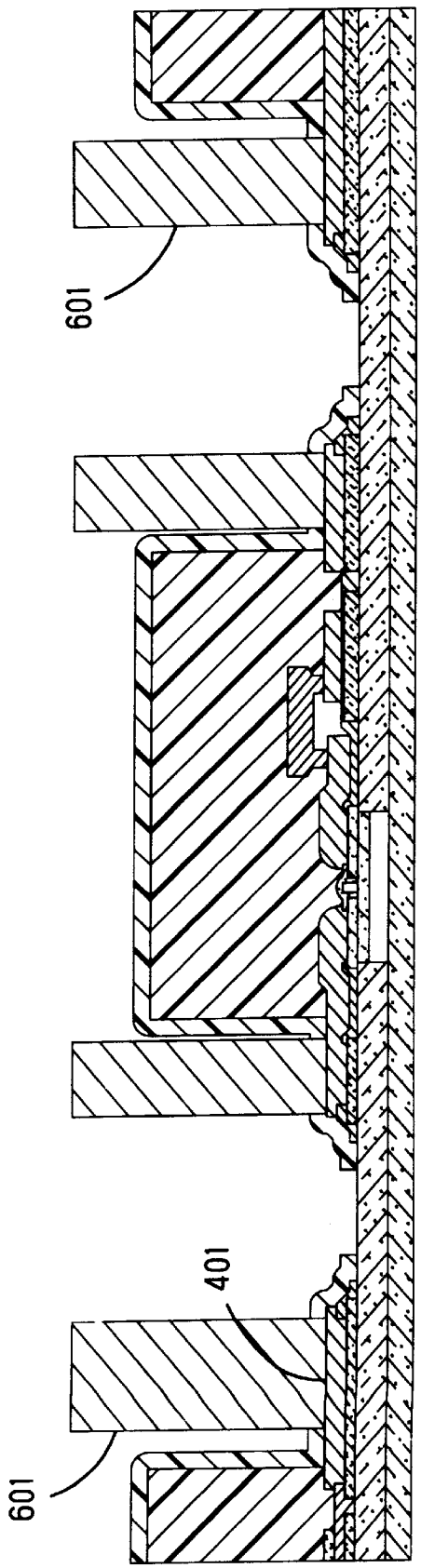
FIG. 6 is a cross sectional view showing the formed solder-bumps or hard bumps on the wafer.

The low dielectric polymer 10 is removed from all bond pads 6 and streets 5 of the MMIC wafer 1, as illustrated in FIG. 3, by first photoexposing the polymer through a negative mask (not shown), and then rinsing the polymer with a conventional polymeric solvent, such as Stoddard solvent or other suitable developers (not shown). The low dielectric polymer is then cured at a low temperature upon the processed MMIC wafer. In reference to FIG. 4, a ceramic coating 401 is deposited over the low dielectric polymer coated MMIC wafer. The ceramic, preferably silicon carbide or silicon nitride is deposited in a thickness on the order of 0.5 microns. The ceramic coating is removed from all bond pads 6 and streets 5 of the MMIC wafer 1, as illustrated in FIG. 5, by first coating the ceramic with a positive photo-resist material, like AZ5200 (not shown), photoexposing the resist through a positive mask (not shown), and then rinsing the resist with a conventional resist developer. The exposed areas of the ceramic coating are then etched using conventional RIE (reactive ion etching) techniques, as illustrated in FIG. 5. Turning to FIG. 6, the solder bumps 601 are disposed on the front side surface of the MMIC as shown. The bumps (hard bumps or solder bumps) are formed on the bonding pads using electroplating. As FIG. 7 illustrates, the polymeric and ceramic coated processed MMIC is finished by backside processing to effect the desired product, by steps well known to the artisan of ordinary skill. FIG. 8 is a view of the finished MMIC wafer having polymeric coating overlaid by a ceramic coating flip chip mounted to a suitable carrier 802 utilizing underfill material 803.

The low dielectric polymer possesses mechanical, electrical and chemical properties that make it compatible with MMIC fabrication processes and capable of use in high-speed MMIC's without the ill effects of capacitance related losses. In particular, the low dielectric polymer is preferably spin-coatable and photo-imageable so that the polymer can be patterned using simple photolithography techniques. Moreover, the polymer would preferably have a low loss tangent, like 0.002 at 10 Ghz, which allows for minimum perturbation in the microwave performance of the MMIC device. Such low dielectric polymers, such as an arylcyclobutene like benzocyclobutene (BCB) as disclosed in U.S. Pat. No. 5,171,824, which is specifically incorporated herein by reference, having dielectric permittivity ranging below 3.0, preferably below 2.0. The use of BCB is known in various applications in high frequency structures and techniques for fabrication thereof. Further examples can be found in U.S. Patent Application to Chinoy et al which is incorporated by reference above.

In addition to its favorable low dielectric constant the polymer also provides sufficient resistance to moisture. This sufficient resistance to moisture is increased by overlaying a ceramic layer, like SiC, upon the low dielectric polymer and other pre-determined areas.

Finally, the polymer provides excellent resistance to mechanical damage during subsequent processing and in particular during final assemble.

In particular, the process of encapsulating the MMIC entails spinning upon the MMIC a uniform coat (known as spin-coating) of the photosensitive, low dielectric polymer and then patterning the polymer using standard photolithography techniques, so that predetermined areas are coated with the BCB, and other areas like bond pads and wafer streets upon the MMIC are exposed. The uniform coating is sufficiently thick to cover the tallest structure on the MMIC, such as air bridges, which usually require about 8 to 10 microns of the polymer. The preferred thickness for capacitive decoupling is as little as 7–8 microns. The polymer is then cured at 250C in a vacuum oven under a nitrogen atmosphere for about an hour. After curing the polymer, the ceramic layer preferably SiC is deposited upon the polymer and the remaining portions of the MMIC by Plasma Enhanced Chemical Vapor Deposition (PECVD) at 250C as referenced in M. Loboda, "Low Temperature PECVD Growth and Characterization of SiC:H. Films Deposited from Silacyclobutane and Silanel Methane Precursor Gases" in Amorphous and Crystalline Silicon Carbide IV, C4 Yang, M. M. Rahman and G. L. Harris, eds; Springer Proc. In Physics (Springer Verlag, Berlin Heidelberg), 71, p. 271–280, 1992, the disclosure of which is specifically incorporated herein by reference. The ceramic layer is then patterned using a standard photoresist layer as the etch mask and etched using Reactive Ion Etching Techniques. Again, the ceramic layer like the polymer leaves portions of the MMIC like bond pads and wafer streets open.

Turning to FIG. 6, the solder bumps 601 are disposed on the front side surface of the MMIC as shown. The bumps (hard bumps or solder bumps) are formed on the bonding pads using electroplating.

Finally, the wafer backside processing is carried out (if needed), which is generally a standard wafer thinning and metallization to provide a ground plane for the integrated circuit.

Finally, turning to FIG. 8 we see the final version of the flip-chip mounted structure. To this end, the MMIC is shown at 801 with the bumps 601 clearly shown. The carrier substrate is shown at 802 with the filler material shown at 803. The carrier substrate can be for example electronics grade glass or other material well known to one of ordinary skill in the art. The final version has the attendant advantages as described above in that flip-chip mounting is enabled by the version of the present disclosure by virtue of the encapsulating material BCB and the ceramic layer silicon carbide having virtually no deleterious effects on the performance of the device. To this end, as stated above, the filler material which is used to reduce the stress between the solder bumps 601 and the carrier substrate 802 has no adverse effect on the performance of the integrated circuit because the thickness of the layer of BCB enables the MMIC to be capacitively decoupled from the package. The solder bumps 601 of the present disclosure having thickness on the order of 3 to 4 mils. These are formed generally by standard metal electroplating or evaporation well known to one of ordinary skill in the art. Finally, the filler material is conventional polymer well known to one of ordinary skill in the art to include such as Dexter Hysol 4526.

The invention having being described in detail it is clear that modifications and variations are well within the purview of one of ordinary skill in the art. To the extent that such modifications and variations of the two-layer hermetic-like coating with the solder bumps for flip-chip mounting are within the purview of the artisan of ordinary skill having had the benefit of the present disclosure, such are deemed within the scope of the present invention.

We claim:

1. A monolithic microwave integrated circuit (MMIC), comprising:
   a substrate on which is disposed circuitry;
   a first layer of polymer encapsulating material, said first layer selectively disposed about said circuitry;
   a second layer of ceramic encapsulating material disposed on said first layer;
   a carrier substrate on which the MMIC is flip-chip mounted; and
   a layer of dielectric filler disposed between said carrier and said MMIC.

2. A MMIC as recited in claim 1 wherein said first layer of encapsulating material is benzocyclobutene (BCB).

3. A MMIC as recited in claim 1 wherein said second layer of encapsulating material is silicon carbide (SiC).

4. A monolithic microwave integrated circuit as recited in claim 2, wherein said BCB has a thickness on the order of 7–10 micrometers.

5. An MMIC as recited in claim 3 wherein said silicon carbide has a thickness on the order of 0.5 micrometers.

6. An MMIC as recited in claim 1 wherein said carrier substrate and said MMIC are separated by a distance of 75 micrometers.

7. An MMIC as recited in claim 1 the MMIC is flip-chip mounted via solder bumps.

8. A monolithic microwave integrated circuit (MMIC), comprising:
   a substrate on which is disposed circuitry;
   a layer of benzocyclobutene (BCB) selectively disposed about said circuitry;
   an encapsulating layer of a compound of silicon disposed on said layer of benzocyclobutene (BCB);
   a carrier substrate on which the MMIC is flip-chip mounted by way of solder bumps; and
   a layer of dielectric filler disposed between said carrier substrate and said MMIC.

9. An MMIC as recited in claim 8 wherein said benzocyclobutene has a thickness on the order of 7–10 micrometers.

10. An MMIC as recited in claim 8 wherein said silicon compound is silicon carbide having a thickness of 0.5 microns.

11. An MMIC as recited in claim 8 where said carrier substrate and said MMIC are separated by a distance of 75 micrometers.

12. An MMIC as recited in claim 8 wherein said solder bumps have a height in the range of 75 micrometers.

13. An MMIC as recited in claim 8 wherein said compound of silicon is silicon nitride.

14. An MMIC as recited in claim 1 wherein said second layer of encapsulating material is silicon nitride.

15. An MMIC as recited in claim 13 wherein said silicon nitride has a thickness on the order of 0.5 micrometers.

16. A monolithic microwave integrated circuit (MMIC), comprising:
   a substrate on which is disposed circuitry;
   a first layer of polymer encapsulating material selectivity disposed about said circuitry; and
   a second layer of ceramic encapsulating material disposed on said first layer wherein said first layer of polymer encapsulating material is benzocyclobutene (BCB).

17. A monolithic microwave integrated circuit (MMIC), comprising:
   a substrate on which is disposed circuitry;
   a first layer of polymer encapsulating material selectivity disposed about said circuitry; and
   a second layer of ceramic encapsulating material disposed on said first layer wherein said second layer of encapsulating material is silicon carbide (SiC).

18. A monolithic microwave integrated circuit as recited in claim 17, wherein said BCB has a thickness on the order of 7–10 micrometers.

19. An MMIC as recited in claim 18 wherein said silicon carbide has a thickness on the order of 0.5 micrometers.

20. An MMIC as recited in claim 16, wherein said second layer of encapsulating material is SiN.

21. An MMIC as recited in claim 20, wherein said layer of SiN has a thickness on the order of 0.5 microns.

22. A monolithic microwave integrated circuit (MMIC), comprising:
   a substrate on which is disposed circuitry;
   an encapsulating layer of benzocyclobutene (BCB) selectively disposed about said circuitry; and
   an encapsulating layer of silicon carbide (SiC) disposed on said layer of benzocyclobutene (BCB).

23. A monolithic microwave integrated circuit as recited in claim 22, wherein said BCB has a thickness on the order of 7–10 micrometers.

24. An MMIC as recited in claim 22 wherein said silicon carbide has a thickness on the order of 0.5 micrometers.

* * * * *